United States Patent
Murtuza

(10) Patent No.: US 6,900,534 B2
(45) Date of Patent: May 31, 2005

(54) DIRECT ATTACH CHIP SCALE PACKAGE

(75) Inventor: Masood Murtuza, Sugarland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/790,946

(22) Filed: Feb. 22, 2001

(65) Prior Publication Data

US 2001/0048157 A1 Dec. 6, 2001

Related U.S. Application Data

(60) Provisional application No. 60/189,741, filed on Mar. 16, 2000.

(51) Int. Cl.[7] .......................... H01L 23/10; H01L 23/34; H01L 23/48; H01L 23/52

(52) U.S. Cl. ...................... 257/707; 257/706; 257/701; 257/702; 257/713; 257/778; 257/738; 257/780; 257/774; 257/737

(58) Field of Search ................................. 257/707, 706, 257/712, 701, 702, 778, 737, 738, 780, 713, 704

(56) References Cited

U.S. PATENT DOCUMENTS

| | | | |
|---|---|---|---|
| 5,273,940 A | | 12/1993 | Sanders |
| 5,308,980 A | * | 5/1994 | Barton .................... 250/338.4 |
| 5,627,405 A | * | 5/1997 | Chillara ....................... 257/668 |
| 5,814,894 A | * | 9/1998 | Igarashi et al. .............. 257/787 |
| 5,883,430 A | * | 3/1999 | Johnson ....................... 257/706 |
| 6,023,094 A | | 2/2000 | Kao et al. .................... 257/632 |
| 6,137,164 A | * | 10/2000 | Yew et al. ................... 257/686 |
| 6,380,621 B1 | * | 4/2002 | Ando et al. ................. 257/707 |

FOREIGN PATENT DOCUMENTS

| | | |
|---|---|---|
| EP | 0 203 591 A2 | 3/1986 |
| EP | 04054668 | 8/1993 |
| WO | WO 00/11919 | 2/2000 |

* cited by examiner

*Primary Examiner*—Nitin Parekh
(74) *Attorney, Agent, or Firm*—Yingsheng Tung; Wade James Brady, III; Frederick J. Telecky, Jr.

(57) ABSTRACT

A reliable, chip scale or flip chip semiconductor device which can be directly attached to a PC board without the use of an underfill material to absorb stress on the solder joints interconnecting the device and board is provided by a silicon chip, having the substrate thinned until the chip thickness is in the range of 50 to 250 microns, attaching a backing or cap layer with specific thermal properties to approximate those of a printed circuit board (PCB), and providing solder bump contacts attached to the input/output terminals.

11 Claims, 3 Drawing Sheets

DIRECT ATTACH CHIP SCALE PACKAGE

This application claims priority under 35 USC § 119 based upon Provisional Patent Application No. 60/189,741 filed Mar. 16, 2000.

FIELD OF THE INVENTION

This invention generally relates to a semiconductor device, and more particularly to a Chip Scale Package for such a device.

BACKGROUND OF THE INVENTION

Typically in the electronic component world, integrated circuits (IC's) are fabricated on a semiconductor substrate, known as a chip, and most commonly are made of silicon. The silicon chip is typically assembled into a larger package which serves to provide effective enlargement of the distance or pitch between input/output contacts of the silicon making it suitable for attachment to a printed circuit board, and to protect the IC from mechanical and environmental damage. With the trend moving to more and more features packed into decreasing product envelopes, utilizing ever smaller electronic components to improve upon size and feature densification a constant and formidable challenge is presented to manufacturers of consumer and related articles.

Recently the semiconductor industry has introduced reduced package sizes, such as those in area array format Vs more typical peripheral attach of the input and output (I/O) terminals as in lead frame construction. However, the area on the printed circuit board (PCB) occupied by the package is still much larger than the area occupied by the silicon chip. The challenge to reduce size and increase density has been felt by the printed circuit board industry, and has resulted in finer lines and closer pad spacing for IC device contacts.

Not only is area of the device of concern, but also the height or thickness, and the overall weight. These issues have been of particular concern to the variety of portable electronic products in use and under development. Integrated circuit chips, as well as the assembled packages have become thinner. There were early concerns that thinning brittle silicon wafers onto which a plurality of chips have been fabricated would lead to an increase in breakage and yield loss. However, these fears were rapidly dispelled as it was realized that thinner wafers were somewhat compliant and were capable of being flexed without breakage. Methods to backlap or grind away the semiconductor substrate were developed for a number of applications. (*) U.S. Pat. No. 5,160,560.

Many companies have been trying to solve the problem of excessive semiconductor package size, and associated performance loss by directly attaching the chip (DCA) to the board without use of a traditional package. However, they have met with varying degrees of success, and with numerous technical challenges not yet overcome.

Direct chip attach has been most commonly via solder bumps or balls from the input/output (I/O) contacts of the chip interconnecting to the PC Board, and providing both electrical and mechanical connections. Because the materials of the silicon chip and the PC board have different rates of thermal expansion, severe stresses are introduced to the solder connection between the rigid chip and the more thermally expansive board. The stresses caused by the thermal expansion coefficient (CTE) mismatch occur during solder reflow, and as power to the IC is cycled on and off. The stresses typically cause mechanical failure in one or more solder joints, and in turn result in electrical failure of the product.

Chip scale packages (CSP) were developed to provide an alternative solution to directly attached flip chips devices. These packages (CSP) represent a new miniature type of semiconductor packaging used to address the issues of size, weight, and performance in electronic products, especially those for consumer products such as telephones, pagers, portable computers, video cameras, etc. Standards have not yet been formalized for CSP, and as a result, many variations exist, and several of which are described in "Chip Scale Package", cited above. In general, the chip is the dominant constituent of a CSP with the area of the package, being no more than 20% greater than the area of the chip itself, but the package has supporting features which make it more robust than direct attachment of a flip chip.

Unfortunately, many chip scale packages suffer similar solder fatigue failures as the DCA flip chip devices. To alleviate the problem, and distribute the stresses, a polymeric filler or under-encapsulant is introduced in liquid form by capillary action to surround the solder balls and fill the void between the chip or CSP and a PC board. The "underfill" cures to a rigid form via time, temperature, ultraviolet exposure, or some combination of theseof.

The "underfill" process has a number of drawbacks, including but not limited to the following: a tedious and time consuming process which must be accomplished by the IC customer, voids being entrapped under the device which lead to stress related failures, poor adhesion of the underfill to one or more of the components resulting in localized stresses, difficult if not impossible to rework process, and fillets of "underfill" material around the perimeter of the device which consume additional board space.

Accordingly, a need exists in the industry for a reliable, true chip scale package which eliminates the need for underfill.

SUMMARY OF THE INVENTION

It is an object of the invention to provide a reliable, chip scale or flip chip semiconductor device which can be directly attached to a PC board without the use of an underfill material to absorb stress on the solder joints interconnecting the device and board.

It is an object of this invention to provide a semiconductor device having a coefficient of thermal expansion approximately equal to that of a printed circuit board, including an integrated circuit chip, and a backing layer.

It is also an object of the current invention to provide a true chip scale package having its perimeter equal to that of the semiconductor chip itself.

Yet another object of the invention is to provide a CSP having a power or ground plane within the backing layer and contacting the chip backside.

It is an object of the invention to provide a true chip scale package with an incorporated heat spreader.

It is further an object of the invention to provide a chip scale package with a very thin silicon chip substrate having greater flexibility than conventional thickness of silicon chips, and which is therefore less subject to fracture.

A further object of the invention is to provide a CSP or flip chip device which can be removed and replaced after assembly onto a circuit board.

The objectives of the invention are accomplished by providing a silicon chip, having the substrate thinned until the chip thickness is in the range of 50 to 250 microns, attaching a backing or cap layer with specific thermal properties to approximate those of a printed circuit board (PCB), and providing solder bump contacts attached to the input/output terminals. Solder bumps are directly attached to input/output terminals of the chip, or are routed through vias in an interposer of a polymeric film attached to the active surface of the chip. The backside of the silicon wafer is reduced in thickness by chemical, mechanical, or chemical-mechanical means, such as are known in the art to provide the chip with a specified thickness. The backing layer comprising an organic, metal or composite material is laminated or molded in sufficient thickness so that the CTE of the combined silicon and backing are a near match to the circuit board, thereby minimizing stress on the solder joints. The perimeter of the backing layer is coincident with that of the chip, thereby forming a real chip scale package.

In a high performance embodiment, a layer of metal is affixed to the backing layer, electrical contact is made to active elements in the back of the chip, thereby providing a power or ground plane, and allowing improved performance of the circuit at little to no additional cost.

In yet another embodiment, the backing layer is fabricated of a thermally conductive material and irregular shape to provide improved thermal dissipation from the chip backside.

The foregoing and other objects, features and advantages of the invention will become more apparent from the following detailed description of a preferred embodiment of the invention which proceeds with references to the accompanying drawings.

DETAILED DESCRIPTION OF THE DRAWINGS

Figure 1:
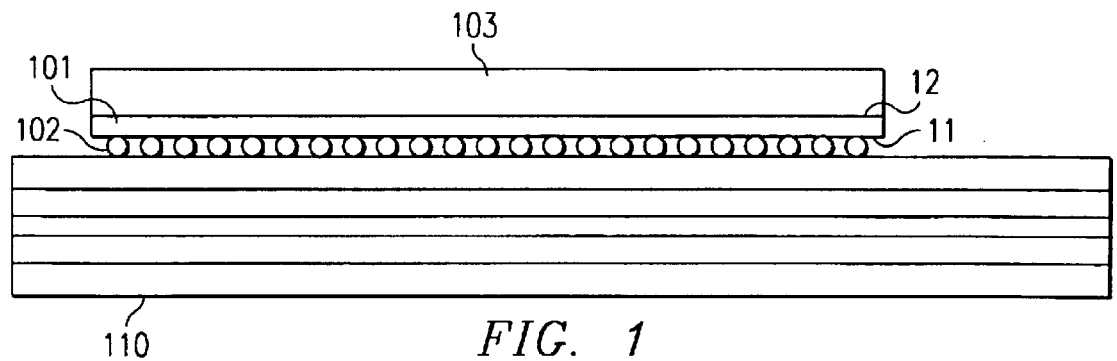
FIG. 1 is a cross section of a semiconductor device directly attached to a printed circuit board.

FIG. 1 is a cross section of a semiconductor device of the current invention directly attached to a printed wiring board. The device includes a number of novel features which provide a reliable, high performance assemblage, and eliminate the need for polymeric underfill material to mitigate stresses on the solder contacts between the board and the device.

The device in FIG. 1 includes an integrated circuit chip 101, having a first surface 11 and a second surface 12. The silicon substrate with exposed second surface 12 is thinned to provide a total chip thickness of 50 to 250 microns. Contact between the active or first surface 11 of the chip and a printed circuit board 110 of known art is made by solder balls 102 thermally reflowed to form electrical and mechanical connections.

The backing or cap layer 103 is affixed to the second surface 12 of the chip using such techniques as laminating or molding. The design and material properties of the backing layer 103, coupled with the less significant contribution of the thinned silicon chip, approximate the thermal expansion characteristics of a printed circuit board 110. This feature is in contrast to existing flip chip or chip scale packages in which the thermal properties of the silicon chip are dominant, and the low expansion of the chip versus the much higher expansion of the circuit board results in stresses on the solder joints which in turn require a costly underfill material and process.

Silicon chips thinned to 50 to 250 microns provide an unusual approach for packaging semiconductor chips. For comparison, typically silicon wafers are processed at approximately 0.7 to 0.8 mm thickness, and are thinned to 0.15 to 0.45 mm prior to assembly into packages. In the preferred embodiment, silicon is made unusually thin in order to allow the thermal properties of the backing layer or cap to become dominant over the coefficient of thermal expansion (CTE) and elastic modulus of the silicon chip. The combined thermal properties of the thin silicon chip and the backing layer result in an effective CTE which is tailored to match or approximate that of the printed circuit board onto which the assemblage is to be attached.

Failure mechanisms in solder joints and the effects of thermal mismatch on solder joints have been discussed and analyzed for a number of years, and based on the preponderance of data, it is known that the thermal properties of the two opposing sides of an assemblage, such as an integrated circuit device and a printed circuit board must either be compensated by a compliant or stress absorbing substance, or the thermal properties of the components must be matched.

Given that the CTE of the silicon chip of the current invention is about $2.3 \times 10-6$ in/in and a typical printed wiring board of FR-4 is about $15 \times 10-6$ PPM, the CTE of the backing layer must slightly exceed that of the PCB. Thickness of the backing required to provide a match to the board is calculated based on chip area, and is generally in the range of 100 to 500 microns. Suitable materials for backing layers are comprised of metals, such as copper, composite materials such as filled polymers and molding compounds, or organic materials. Stress between the silicon and backing is mitigated by a low modulus backing or a compliant adhesive.

In a preferred embodiment, the backing layer 103 is laminated onto a fully processed silicon wafer having a plurality of integrated circuits. The wafer has been reduced in thickness by chemical, mechanical, or chemical-mechanical means known in the art to the calculated preferred thickness. A backing material formed in the circular shape of the silicon wafer has a thin adhesive on the surface which is mated to the wafer backside. Following lamination of the backing under heat and pressure, the wafer with attached backing is diced into a plurality of CSP devices. Alternately, the backing layer is molded onto the wafer backside using a composite molding compound.

Figure 2:
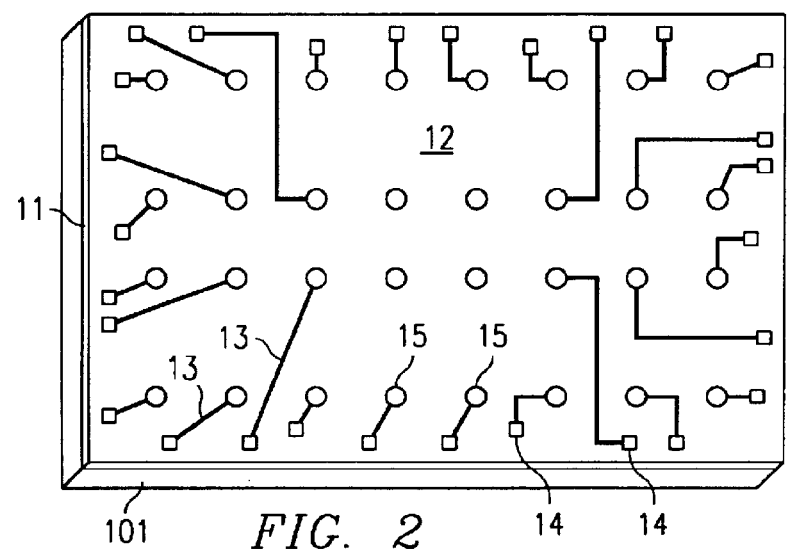
FIG. 2 illustrates rerouting of chip i/o's to a preselected area array.

In one embodiment shown in FIG. 2, the first surface 11 of the silicon chip 101 is protected by a thin film dielectric layer 12, such as a polyimide or BCB polymer which supports thin metallized interconnecting patterns 13 used to redistribute the chip I/Os 14 to a preferred pitch and pattern of contact pads 15 compatible with the receiving pads on a circuit board. By redistributing the often irregularly positioned I/O contact pads on the chip 14, an area array having standardized spacing is provided for the pads 15. Interconnection patterning and redistribution of I/Os is included in the wafer processing prior to backlapping or thinning of the wafer.

Figure 3:
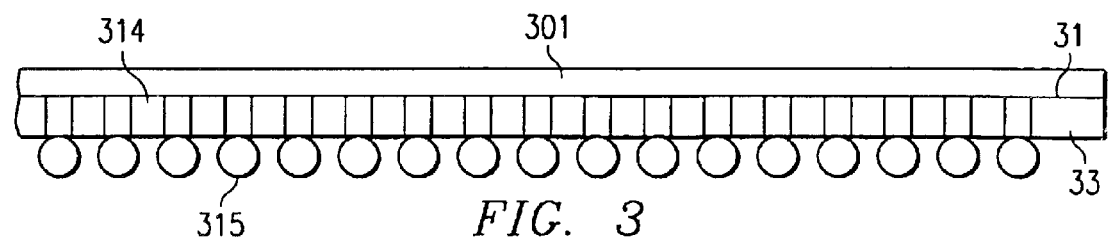
FIG. 3 is a cross section of an interposer with solder bump contacts.
Figure 4A:
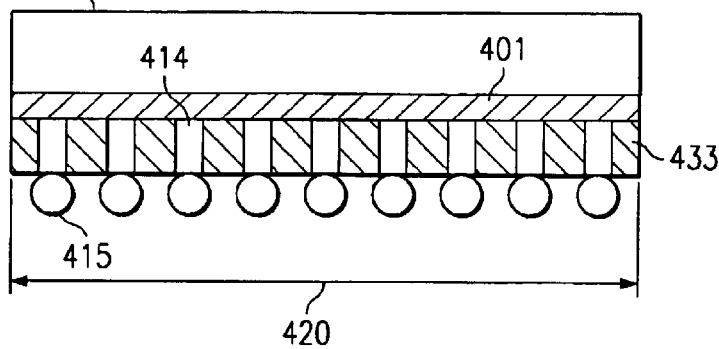
FIG. 4a is a cross section of a Chip Scale Package of the current invention.

In an alternate embodiment in FIG. 3, a flexible film interposer 33 having metallized interconnections and redistribution of I/Os is laminated to the first surface 31 of the chip 301. Conductive vias 314 in the flexible dielectric film 33 provide interconnection between the chip I/Os and the solder balls 315 on the opposite surface of the film. Flexible film interposers 33 are applied either to the wafer, or preferably to the singulated chips, using techniques known in the art of fabricating chip scale packages. Flexible film interposers typically comprise a thermally stable film of the polyimide family with copper interconnections and plated vias. FIG. 4a is a cross section of the fully fabricated CSP 420 of this invention, including a flexible film interposer 433 attached to the first surface of a thin silicon chip 401, and a CTE controlling backing or cap layer 403 attached to the second or back surface of the silicon chip. Solder balls 415 are connected to the chip I/Os by conductive vias 414 in the flexible film interposer. Thermal properties of the backing 403 combined with the chip are matched to those of a PCB. Flexible film interposers are sufficiently thin to be negligible in the CTE calculation of the assemblage.

Figure 4B:
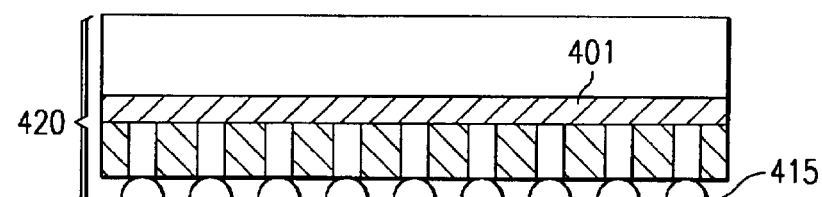
FIG. 4b is a CSP attached to a printed circuit board

In FIG. 4b, the CSP 420 is attached to a printed wiring board 425. The robust CSP assemblage 420, is readily assembled onto a PCB using automated pick and place equipment known in the industry, and no laborious underfill processing is required, as a result of the CTE match between device and PBC. The semiconductor device may be removed and replaced simply by localized heating to remelt the solder, so long as the metallization on the receiving pad is intact. The ability to rework and replace devices without contamination from foreign materials such as underfill compound provide a major advantage the printed circuit board user over existing technology having underfill material.

Figure 5:
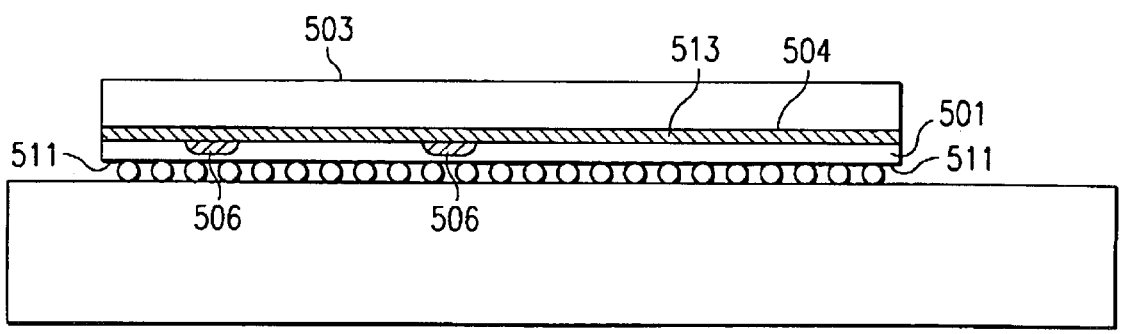
FIG. 5 is a cross section of a High Performance Chip Scale Package attached to a printed circuit board.
Figure 6:
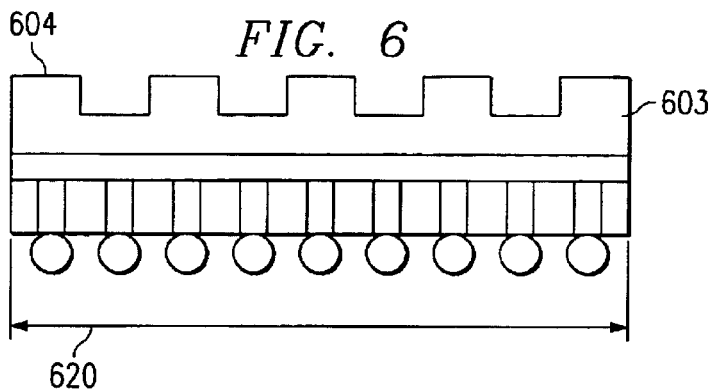
FIG. 6 is a cross section of a Chip Scale Package with a heat spreader backing.

Integrated circuits are often designed and fabricated with active elements buried well below the surface, and which function more efficiently if those active elements are able to contacted to a power or ground plane directly. In particular, circuits requiring power or ground contact to buried elements are well suited for a CSP device, such as a high performance embodiment of the current invention illustrated in FIG. 5. The integrated circuit chip 501 includes a plurality of active well or trench structures 506 extending 50 microns or more below the first surface 511 of the chip. The wafer is thinned from the backside to expose those active elements, thereby making it possible for electrical contact to be made by a metallized power or ground plane 513 on the first surface 504 of a backing layer 503. The metallized plane 513 is brought into contact with the exposed elements 506 of the circuit, and electrical connection is made between the circuits and ground plane by conductive adhesives, or mechanical contact of the surfaces held in compression. A low cost, high performance package with a ground plane is formed on the backing layer by vapor depositing or laminating a thin film of metal.

In yet another embodiment, the backing or cap layer 603 of a thermally enhanced CSP 620 may be formed with an array of raised areas which provide a means for improved thermal dissipation. The irregularly shaped backside layer 603 molded from a thermally conductive composite material, allows improved thermal dissipation by having an increased surface area for radiation cooling by the ambient, as well as forming channels for air flow. As with the previous embodiments, the thermal expansion of the combined silicon and backing layers are matched to that of a printed wiring board. High thermal conductivity backing layers are comprised of molded polymers compounded with such materials as carbon, particulate metallic, or conductive inorganic components.

A number of process options exist for fabricating a semiconductor device of the current invention; namely a reliable flip chip or CSP package for direct attachment to a printed circuit board. Most of the individual processes and materials of construction are known in the industry, but in the following steps are combined to fabricate a direct chip attach device of the current invention.

Figure 7A:
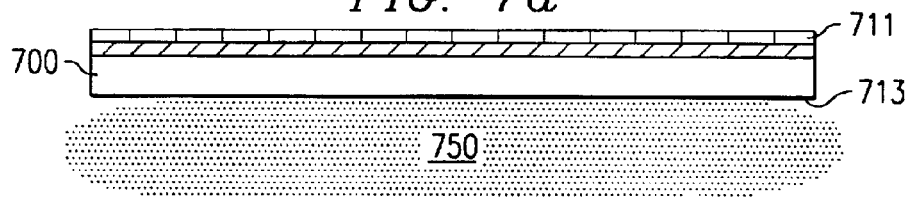
FIGS. 7a through 7e are process steps in fabrication of a direct chip attach device of the current invention.
Figure 7B:
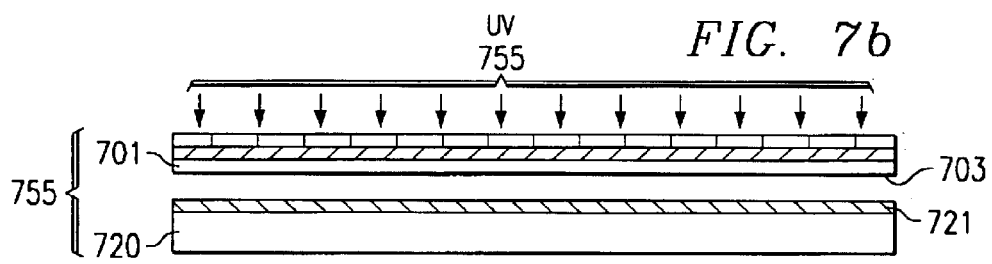
Figure 7C:
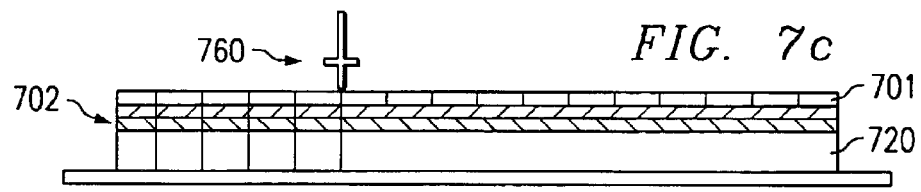

In the preferred embodiment, illustrated in FIGS. 7a through 7e a semiconductor wafer 700 having a plurality of integrated circuits fabricated on the first surface 711 is backlapped from the second surface 713 to a provide a 50 micron thick wafer 701 by chemical-mechanical polishing technique 750. In the next step, shown as FIG. 7b, a backing layer 720 approximately 0.1 to 0.5 mm thickness, precut to the circular shape and size of the silicon wafer, and having a vapor deposited thin film of gold 721, in the range of 50 to 100 angstroms thickness is attached to the wafer by a UV sensitive adhesive 703 using UV exposure indicated by arrows 755. The backing layer comprises a material having an expansion coefficient very near, or slightly greater than that of the PCB, such as a BT resin with expansion coefficient of approximately 16 PPM. In FIG. 7c, the wafer with attached backing or cap layer is diced using a saw 760 or laser technique into a plurality of individual capped chips 702.

Figure 7D:
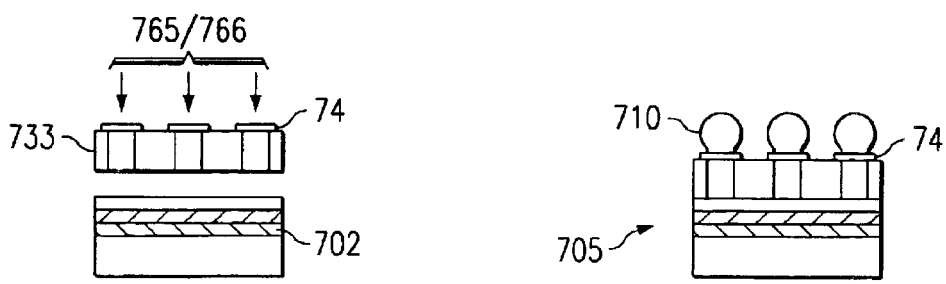
Figure 7E:
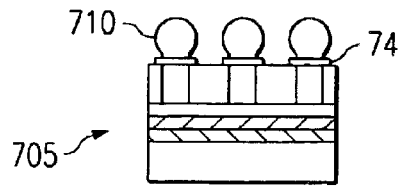

A preformed flex film interposer 733 having perimeter equal to that of the singulated device 702, is aligned to and positioned on first surface of the chip, heat 765 and pressure 766 are applied to laminate the film, and to complete curing of the adhesive to the backing layer, in FIG. 7d. The assembled CSPs 705 are cleaned to remove any contamination from the vias and contact pads 74 by a plasma assisted sputtering, and in FIG. 7e solder balls 710 are positioned on each of the i/o lands 74 on the interposer and attached by thermal reflowing.

In an alternate embodiment, the wafer having a thin film dielectric with patterned metallization for I/O rerouting as shown in FIG. 2 is thinned as previously described in FIG. 7a to a thickness of about 100 microns. The wafer is diced using a diamond saw, as illustrated in FIG. 7c into individual chips. Each chip is positioned in a cavity of a mold press lined with release agent, and molding compound having an expansion coefficient of about 20 PPM is injected into the cavity and forced to cover the backside of each chip. The molded cap is in the range of 0.1 to 0.5 mm thickness. Following ejection from the mold, solder balls are positioned on the cleaned I/O lands of the rerouted interconnections on the surface of the chip, and solder heated to reflow.

Detailed descriptions of preferred embodiments are provided herein. It is to be understood that the present invention may be embodied in various forms. Therefore, specific details disclosed herein are not to be interpreted as limiting, but rather as a basis for teaching one skilled in the art to employ the present invention in virtually any appropriate detailed system, structure or manner.

What is claimed is:

1. A semiconductor device, comprising:
   an integrated circuit chip having a first surface and a second surface, said first surface including a circuit and contact pads;
   a backing layer on said second surface of said chip and having dimensions substantially the same as said chip, said backing layer having a coefficient of thermal expansion higher than the coefficient of thermal expansion of said chip, said chip and said backing layer having a composite coefficient of thermal expansion; and a printed wiring board having a coefficient of thermal expansion substantially the same as said composite coefficient of thermal expansion, said printed wiring board including contact pads coupled to said contact pads on said first surface of said chip.

2. The semiconductor device of claim 1 wherein said backing layer is mold compound.

3. The semiconductor device of claim 1, wherein said backing layer is a filled polymer.

4. The semiconductor device of claim 1 wherein said backing layer is a metal.

5. The semiconductor device of claim 1 wherein said chip has a thickness in the range of 50 to 250 microns and said backing layer has a thickness in the range of 100 to 500 microns.

6. The semiconductor device of claim 1 wherein said printed wiring board is FR-4.

7. A semiconductor device, comprising:

an integrated circuit chip having a first surface and a second surface, said first surface including a circuit and contact pads;

a backing layer on said second surface of said chip and having dimensions substantially the same as said chip, and said backing layer having a coefficient of thermal expansion higher than the coefficient of thermal expansion of said chip, said chip and said backing layer having a composite coefficient of thermal expansion;

a dielectric redistribution layer over said first surface of said chip and having dimensions substantially the same as said chip, said redistribution layer including a first surface adjacent to said first surface of said chip and a second surface away from said chip, said second surface including interconnection patterns connected to contact pads on said first surface of said chip through vias through said redistribution layer, wherein said contact pads on said redistribution layer have a different arrangement than said contact pads on said chip; and a printed wiring board having a coefficient of expansion substantially the same as said composite coefficient of thermal expansion, said printed wiring board including contact pads coupled to said contact pads on said first surface of said chip.

8. The semiconductor device of claim 7 wherein said dielectric redistribution layer comprises polyimide.

9. The semiconductor device of claim 7 wherein said dielectric redistribution layer comprises Benzocyclobutene resin.

10. The semiconductor device of claim 7, wherein said backing layer is mold compound.

11. The semiconductor device of claim 7 wherein said backing layer is a filled polymer.

* * * * *